US012393540B2

(12) United States Patent
Pacheco et al.

(10) Patent No.: US 12,393,540 B2
(45) Date of Patent: Aug. 19, 2025

(54) FLEXIBLE BACKPLANE FOR SYSTEM OPERATIONS

(71) Applicant: Woodward, Inc., Fort Collins, CO (US)

(72) Inventors: Steve Pacheco, Fort Collins, CO (US); Mariusz Kaleta, Fort Collins, CO (US); Adam Kropek, Fort Collins, CO (US); Bryan W. Guild, Fort Collins, CO (US); Andrzej Kuchta, Fort Collins, CO (US)

(73) Assignee: Woodward, Inc., Fort Collins, CO (US)

( * ) Notice: Subject to any disclaimer, the term of this patent is extended or adjusted under 35 U.S.C. 154(b) by 0 days.

(21) Appl. No.: 18/223,377

(22) Filed: Jul. 18, 2023

(65) Prior Publication Data

US 2025/0028668 A1 Jan. 23, 2025

(51) Int. Cl.
*G06F 13/40* (2006.01)
*G06F 1/26* (2006.01)
*G06F 13/20* (2006.01)

(52) U.S. Cl.
CPC .......... *G06F 13/4027* (2013.01); *G06F 1/266* (2013.01); *G06F 13/20* (2013.01)

(58) Field of Classification Search
None
See application file for complete search history.

(56) References Cited

U.S. PATENT DOCUMENTS

| 6,338,101 | B1* | 1/2002 | Kakimi | G06F 13/20 711/170 |
| 6,349,037 | B1 | 2/2002 | Draughn et al. | |
| 9,430,437 | B1* | 8/2016 | Krishnan | G06F 13/4027 |
| 2002/0161924 | A1* | 10/2002 | Perrin | H04L 45/583 709/240 |
| 2002/0161929 | A1* | 10/2002 | Longerbeam | H04L 45/583 709/250 |
| 2007/0025095 | A1* | 2/2007 | Beall | G06F 1/187 361/799 |

(Continued)

OTHER PUBLICATIONS

[No Author Listed], "PACSystems RX3i System Manual—GFK-2314T," Emerson, Sep. 2019, 908 pages.

(Continued)

*Primary Examiner* — Henry Tsai
*Assistant Examiner* — Christopher A Bartels
(74) *Attorney, Agent, or Firm* — Fish & Richardson P.C.

(57) ABSTRACT

A backplane that includes a first processor slot, a second processor slot, a plurality of input/output (I/O) slots, a first I/O bus, a second I/O bus electrically isolated from the first I/O bus, and a plurality of I/O connection ports. The first processor slot includes a first processor connection port having a plurality of pins electrically connected to a first processor bus. The second processor slot includes a second processor connection port having a plurality of pins connected to a second processor bus, that is electrically isolated from the first processor bus. The plurality of I/O connection ports each include a first set of pins electrically connected to the first I/O bus, and a second set of pins electrically connected to the second I/O bus. Each of the first processor slot, the second processor slot, and the plurality of I/O slots include at least one of the I/O connection ports.

20 Claims, 5 Drawing Sheets

(56) References Cited

U.S. PATENT DOCUMENTS

| | | | |
|---|---|---|---|
| 2012/0081851 A1* | 4/2012 | Trinh | G11B 33/126 |
| | | | 361/679.02 |
| 2017/0052919 A1 | 2/2017 | Purcell et al. | |
| 2017/0344445 A1* | 11/2017 | Vanderah | G05B 19/00 |
| 2018/0026872 A1* | 1/2018 | Manthiramoorthy | ......... |
| | | | H04L 12/437 |
| | | | 370/249 |
| 2020/0376402 A1* | 12/2020 | Wellejus | G06F 13/20 |
| 2021/0258265 A1* | 8/2021 | Guim | G06F 11/3006 |
| 2022/0046114 A1* | 2/2022 | Entelis | H04L 12/40 |

OTHER PUBLICATIONS

[No Author Listed], "Product Manual 26166V1—MicroNet Simplex Digital Control; MicroNet Plus Digital Control," Woodward, Jun. 2019, vol. 1, Section 3.1.1, 23 pages.

International Search Report and Written Opinion in International Appln. No. PCT/US2024/038405, mailed on Nov. 5, 2024, 14 pages.

* cited by examiner

FLEXIBLE BACKPLANE FOR SYSTEM OPERATIONS

BACKGROUND

Industrial systems are specialized electronic computer systems used for the control of and protection of industrial machines or processes, for example, in a factory environment. Various hardware modules that perform control and safety operations for industrial systems are generally coupled together through an electronic backplane. A backplane includes the communication and power buses that tie all the modules together. The backplane allows different types of hardware modules to be combined to suit a specific industrial application. For instance, hardware modules include central processing unit (CPU) modules, input/output (I/O) modules, power supplies, memory modules, etc.

Typically, industrial applications that require a control system and safety supervision, segregate the control and safety systems using two individually dedicated backplanes physically separated from one another. Segregation between the control and safety systems is desired to ensure the integrity of the safety system. Other methods include backplanes which designate specific module connection slots to control modules and others to safety modules to maintain separation between safety systems and operational control systems. However, such designs limit the modularity and flexibility of permitted control and safety system design.

SUMMARY

This specification describes an industrial system, e.g., an industrial control and/or safety system, that has a backplane having multiple slots. Each slot has one or more connectors for removably receiving one or more modules. Each of at least some of the connectors has two sets of pins, one coupled to a first communication bus and the other coupled to a second communication bus.

In general, innovative aspects of the subject matter described in this specification can be embodied in an electronic backplane. The backplane includes a first processor slot, a second processor slot, a plurality of input/output (I/O) slots, a first I/O bus, a second I/O bus electrically isolated from the first I/O bus, and a plurality of I/O connection ports. The first processor slot includes a first processor connection port having a plurality of pins electrically connected to a first processor bus. The second processor slot includes a second processor connection port having a plurality of pins connected to a second processor bus, that is electrically isolated from the first processor bus. The plurality of I/O connection ports each include a first set of pins electrically connected to the first I/O bus, and a second set of pins electrically connected to the second I/O bus. Each of the first processor slot, the second processor slot, and the plurality of I/O slots include at least one of the I/O connection ports. This and other implementations can each optionally include one or more of the following features.

Some implementations include a third processor slot including a third processor connection port having a plurality of pins electrically connected to the first processor bus enabling communication with a processor module connected to the first processor connection port of the first processor slot, and a fourth processor slot including a fourth processor connection port having a plurality of pins electrically connected to the second processor bus enabling communication with a processor module connected to the second processor connection port of the second processor slot.

Some implementations include a power supply slot including a power connection port having at least two pins electrically connected to a power bus, and at least one of the I/O connection ports. In some implementations, the power supply slot comprises at least two of the I/O connection ports.

In some implementations the plurality of I/O connection ports are aligned in a row along a bottom of the electronic backplane, and the first processor connection port and the second processor connection port are aligned in a row above a respective I/O connection port in the first processor slot and in the second processor slot.

Some implementations include a first I/O module installed in a first one of the I/O slots and electrically connected to the I/O connection port of the first one of the I/O slots, where the first I/O module is configured to send and receive data communications only through the first set of pins; and a second I/O module installed in a second one of the I/O slots and electrically connected to the I/O connection port of the second one of the I/O slots, where the second I/O module is configured to send and receive data communications only through the second set of pins. In some implementations, the first I/O module is a control I/O module and the second I/O module is a safety I/O module. In some implementations, the first I/O module includes a first I/O port connection interface that has a first set of interface pins that align with and couple to the first set of pins of the I/O connection port of the first one of the I/O slots, and the second I/O module includes a second I/O port connection interface that has a second set of interface pins that align with and couple to the second set of pins of the I/O connection port of the second one of the I/O slots. In some implementations, the first I/O module includes a first I/O port connection interface that has a first set of interface pins that align with and couple to the first set of pins of the I/O connection port of the first one of the I/O slots, and a second set of interface pins that align with and couple to the second set of pins of the I/O connection port of the first one of the I/O slots, and the first I/O module is configured to disable data communications through the second set of interface pins. In some implementations, the first I/O module includes non-transitory computer readable memory comprising computer instructions that, when executed, disable data communications through the second set of interface pins.

In some implementations, the first processor connection port includes a third set of pins and a fourth set of pins, where the third set of pins include the plurality of pins that are electrically connected to the first processor bus, and the fourth set of pins are electrically connected to the second processor bus.

Another general aspect can be embodied in an industrial system that includes a machine and a control/safety system coupled to the machine and configured to operate the machine. The control/safety system includes a backplane. The backplane includes a first input/output (I/O) bus, a second I/O bus electrically isolated from the first I/O bus, a plurality of I/O connection ports, and a plurality of module slots. The a plurality of I/O connection ports each include a first set of pins electrically connected to the first I/O bus, and a second set of pins electrically connected to the second I/O bus. The plurality of module slots is each configured to receive a hardware module and each module slot comprising an I/O connection port. The backplane includes a control processor module installed in a first one of the module slots, a safety processor module installed in a second one of the module slots, a control I/O module installed in a third one of the module slots, and a safety I/O module installed in a fourth one of the module slots. The control processor module is configured to communicate control data with the control I/O module through the first I/O bus, and the safety processor module is configured to communicate safety data with the safety I/O module through the second I/O bus. This and other implementations can each optionally include one or more of the following features.

In some implementations, the control I/O module includes a first I/O port connection interface that has a first set of interface pins that align with and couple to the first set of pins of the I/O connection port of the third one of the I/O slots, and the safety I/O module includes a second I/O port connection interface that has a second set of interface pins that align with and couple to the second set of pins of the I/O connection port of the fourth one of the I/O slots.

In some implementations, the control I/O module includes an I/O port connection interface that has a first set of interface pins that align with and couple to the first set of pins of the I/O connection port of the third one of the I/O slots, and a second set of interface pins that align with and couple to the second set of pins of the I/O connection port of the third one of the I/O slots, where the control I/O module is configured to disable data communications through the second set of interface pins. In some implementations, the control I/O module includes non-transitory computer readable memory comprising computer instructions that, when executed, disable data communications through the second set of interface pins.

In some implementations, the safety I/O module includes an I/O port connection interface that has a first set of interface pins that align with and couple to the first set of pins of the I/O connection port of the fourth one of the I/O slots, and a second set of interface pins that align with and couple to the second set of pins of the I/O connection port of the fourth one of the I/O slots, where the safety I/O module is configured to disable data communications through the first set of interface pins. In some implementations, the safety I/O module includes non-transitory computer readable memory comprising computer instructions that, when executed, disable data communications through the first set of interface pins.

Another general aspect can be embodied in an electronic backplane that includes a first input/output (I/O) bus, a second I/O bus electrically isolated from the first I/O bus, a plurality of I/O connection ports, a first processor slot, a second processor slot, a third processor slot, a fourth processor slot, a power supply slot, and a plurality of I/O slots. The first processor slot is configured to receive a first processor module and includes a first one of the I/O connection ports and a first processor connection port having a plurality of pins electrically connected to a first processor bus. The second processor slot is configured to receive a second processor module and includes a second one of the I/O connection ports and a second processor connection port having a plurality of pins connected to a second processor bus, that is electrically isolated from the first processor bus. The third processor slot is configured to receive a third processor module and includes a third one of the I/O connection ports and a third processor connection port having a plurality of pins electrically connected to the first processor bus enabling data communication through the first processor connection port of the first processor slot. The fourth processor slot is configured to receive a fourth processor module and includes a fourth one of the I/O connection ports and a fourth processor connection port having a plurality of pins electrically connected to the second processor bus enabling data communication through the second processor connection port of the second processor slot. The power supply slot is configured to receive a power supply and includes a power connection port having at least two pins electrically connected to a power bus and a fifth one of the I/O connection ports. The plurality of I/O slots are each configured to receive a hardware module and each I/O slot comprising at least one of the I/O connection ports. This and other implementations can each optionally include one or more of the following features.

In some implementations, the power supply slot includes at least one of the I/O connection ports.

In some implementations, the plurality of I/O connection ports are aligned in a row along a bottom of the electronic backplane, and the first processor connection port and the second processor connection port are aligned in a row above a respective I/O connection port in the first processor slot and in the second processor slot.

Some implementations include a first I/O module installed in a first one of the I/O slots and electrically connected to the I/O connection port of the first one of the I/O slots, where the first I/O module is configured to send and receive data communications only through the first set of pins; and a second I/O module installed in a second one of the I/O slots and electrically connected to the I/O connection port of the second one of the I/O slots, where the second I/O module is configured to send and receive data communications only through the second set of pins.

Particular embodiments of the subject matter described in this specification can be implemented so as to realize one or more of the following advantages. The industrial system described in this specification provides the configurability and customizability that fit any of a wide range of industrial control applications. The described industrial system allows for efficient creation of new industrial functions which were previously unavailable or nonexistent by having a backplane having flexible slots that can each receive modules with different functionalities. By utilizing both separate pins and separate communication buses, data communication between various modules is less likely to interfere with each other, thus the described industrial system achieves robust and reliable performance even with the flexible configuration.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
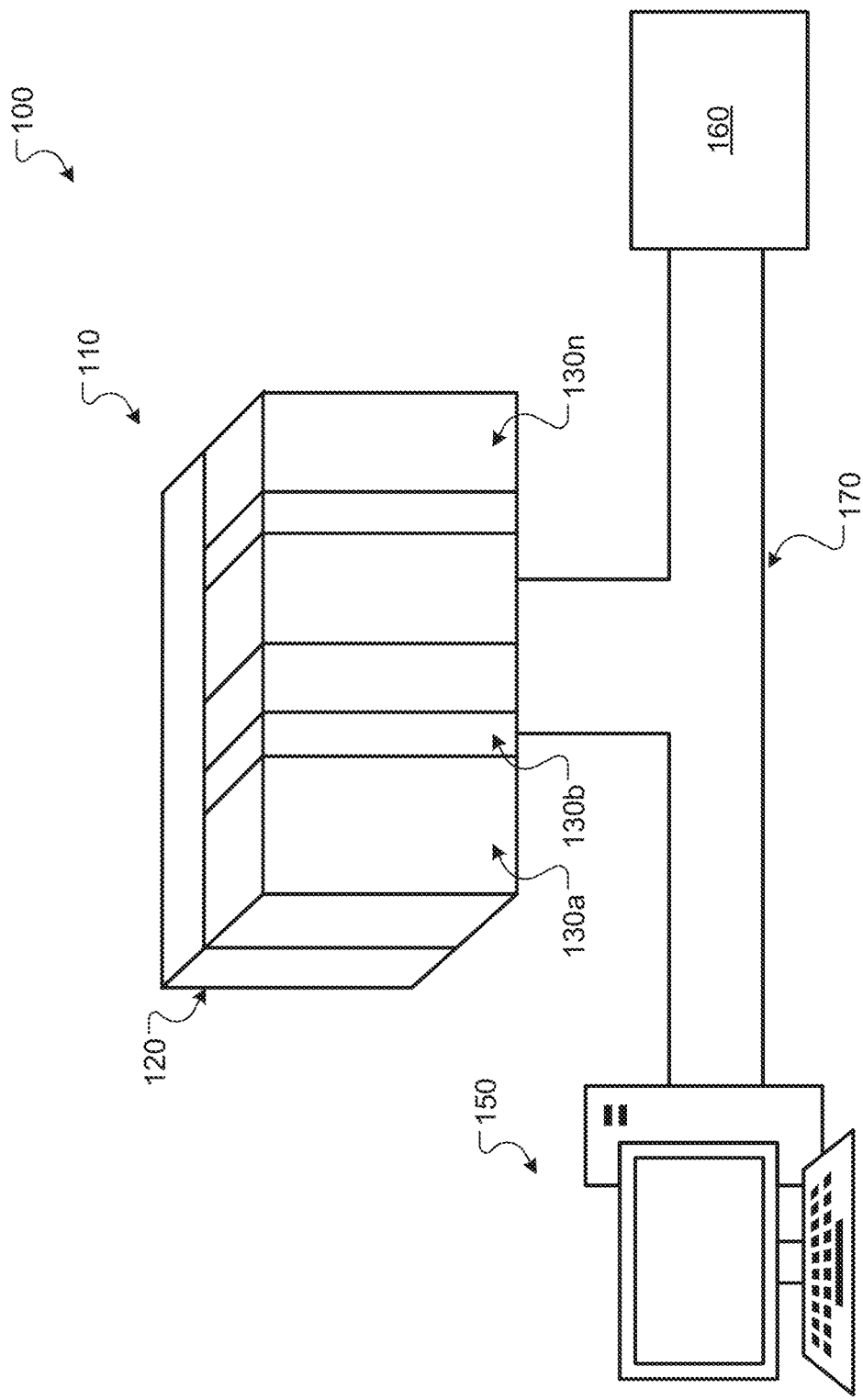
FIG. 1 is an illustration of example components of an industrial system.

FIG. 1 is an illustration of example components of an industrial system 110. The industrial system 110 allows for control and/or monitoring of a machine/process 160. The machine/process 160 may take many forms and include devices for accomplishing many different and varied purposes. For example, the machine/process 160 can include an industrial turbine, a manufacturing line or station, a material handling system, an assembly process, a compressor station, an oil refinery, a batch operation for making food items, or any mechanized and automated system. Accordingly, the machine/process 160 may include a variety of operational components, such as electric motors, motor drives and controllers, sensors and instrumentation, actuators, feedback devices, automation controllers, computers, and so on. The machine/process 160 will typically include control and safety monitoring equipment for regulating process variables through automation and/or monitoring. The control and safety monitoring systems are segregated from one another to ensure the dependability and integrity of the safety systems. For instance, in many applications control and safety monitoring systems each use separate CPUs, I/O modules and sensors, controllers, actuators, and memory to avoid cross-talk between systems. Each system has a distinct, and often, competing purpose. Control systems are generally designed to maintain a machine running, whereas a safety monitoring system is designed to shut the machine down in the event of a fault or an emergency. Furthermore, safety systems are often certified to international safety standards, whereas control systems often are configured, programed, and tailored to the user needs without agency approvals.

For example, the machine/process 160 has actuators and sensors. The actuators include one or more devices, e.g., motors and associated drives, adapted to perform a mechanical action in response to a signal from the industrial system 110. The sensors include one or more devices that provide information regarding the operation and/or conditions of the machine/process 160 to the motors and associated drives, such as for monitoring, open and closed-loop control, and so on. The actuators and sensors serve to allow automation of the machine/process 160 in accordance with programming, protocols, or other control or safety profiles implemented by the industrial system 110.

The sensors and actuators may be utilized within any number of predetermined process loops that are monitored and controlled by the industrial system 110 or any other control and/or safety monitoring equipment located locally with the industrial system 110 or remotely (e.g., enterprise systems, remote monitoring systems, etc.). Such process loops may be activated based on process inputs (e.g., input from one of the sensors) or direct operator input (e.g., input received via a human-machine interface associated with the industrial system 110). An industrial environment may include more than one industrial system 110, and these may operate independently or inter-dependently in accordance with the nature and operation of the machine/process 160.

To control and/or monitor the machine/process 160, the industrial system 110 includes multiple hardware modules 130a-n including, for example, control processor modules, safety processor modules, input/output modules, memory modules, controller modules, and power supply modules. The industrial system 110 provides a backplane 120 on which the multiple modules 130a-n can be installed. The backplane 120 also provides communication between the multiple modules 130a-n. Each module 130a-n may have a single housing or, optionally, a combination of modules including a single housing. Each module 130a-n module can include one or more computer processors, memory, communication interfaces, other electronic circuits, and computer software configured to perform various control or safety/monitoring operations; including interfacing with and performing data communication through the backplane 120.

In particular, the industrial system 110 has a flexible configuration, e.g., with additional modules added or existing modules removed and the industrial system 110 reconfigured to accommodate a new configuration. The industrial system 110 can include any number of control processors, safety processors, or input/output processors, up to a maximum possible number of modules 130a-n that can be installed, that can be combined in any combination that fits the needs of the machine/process 160.

The control processor is configured to execute a control program to control normal operation of the machine/process 160. For example, the control processor receives feedback signals through an I/O module from sensors on the controlled machine/process 160 corresponding to the present operating state and generates output signals with the control program to actuators and to the associated drives as a function of the feedback signals to achieve a desired operation of the controlled machine/process 160.

The safety processor can disable the operation of the controlled machine/process 160 upon detecting a fault or emergency situation. For example, the safety processor selectively controls safety trips for the motors and associated drives to allow normal operation or to place the motors and associated drives into a safe condition, thereby preventing operation of the machine/process 160.

Generally, the control processor or the safety processor may be implemented using general purpose or specialized independently functioning computing devices, e.g., microprocessors, which may have internal or external static or dynamic memory for storing variables and/or program instructions (e.g., software or firmware) that describe a desired control or safety profile of the machine/process 160.

The input/output processor provides an interface to the actuators and sensors. The input processor receives signals from sensors, switches, and other devices providing the operating status of the controlled machine/process 160. The control processor executes a control program which receives the input signals from the input processor and generates control output signals in response to the operating status of the controlled machine/process 160. The control output signals of the control processor are delivered from the output processor to actuators, indicators, and/or other devices to achieve a desired operation of the controlled machine/process 160. In the meantime, the safety processor executes a safety profile which recognizes an input signal from the input processor as being indicative of a safety hazard and generates safety output signals. The safety output signals of the safety processor are delivered from the output processor to the actuators, indicators, and/or other devices to stop or interrupt the machine/process 160, or put the machine/process 160 into a safe state.

The industrial system 100 can include a programming terminal 150. The programming terminal 150 typically includes a human machine interface (HMI), which provides an operator interface that allows the configuring, modifying, debugging and maintaining of the industrial system 110. The programming terminal 150 may be a standard desktop or laptop computer and include a keyboard, display screen, and the like to permit the entry and display of data and the operation of a control program by a human operator.

Components of the industrial system 110 such as the programming terminal 150, and the machine/process 160, including its actuators and sensors, may be coupled to and/or in communication with a data network 170. The data network 170 may be used to send and receive data. For example, data from the sensors is relayed to the industrial system 110, and output signals (or other commands that change operational parameters of the actuators of the machine/process 160) from the industrial system 110 are sent to the actuators via the data network 170. In some implementations, the data network 170 is an industrial control network, such as one using Common Industrial Protocols (CIP), e.g., an EtherCAT, CAN bus, or Modbus network.

Figure 2:
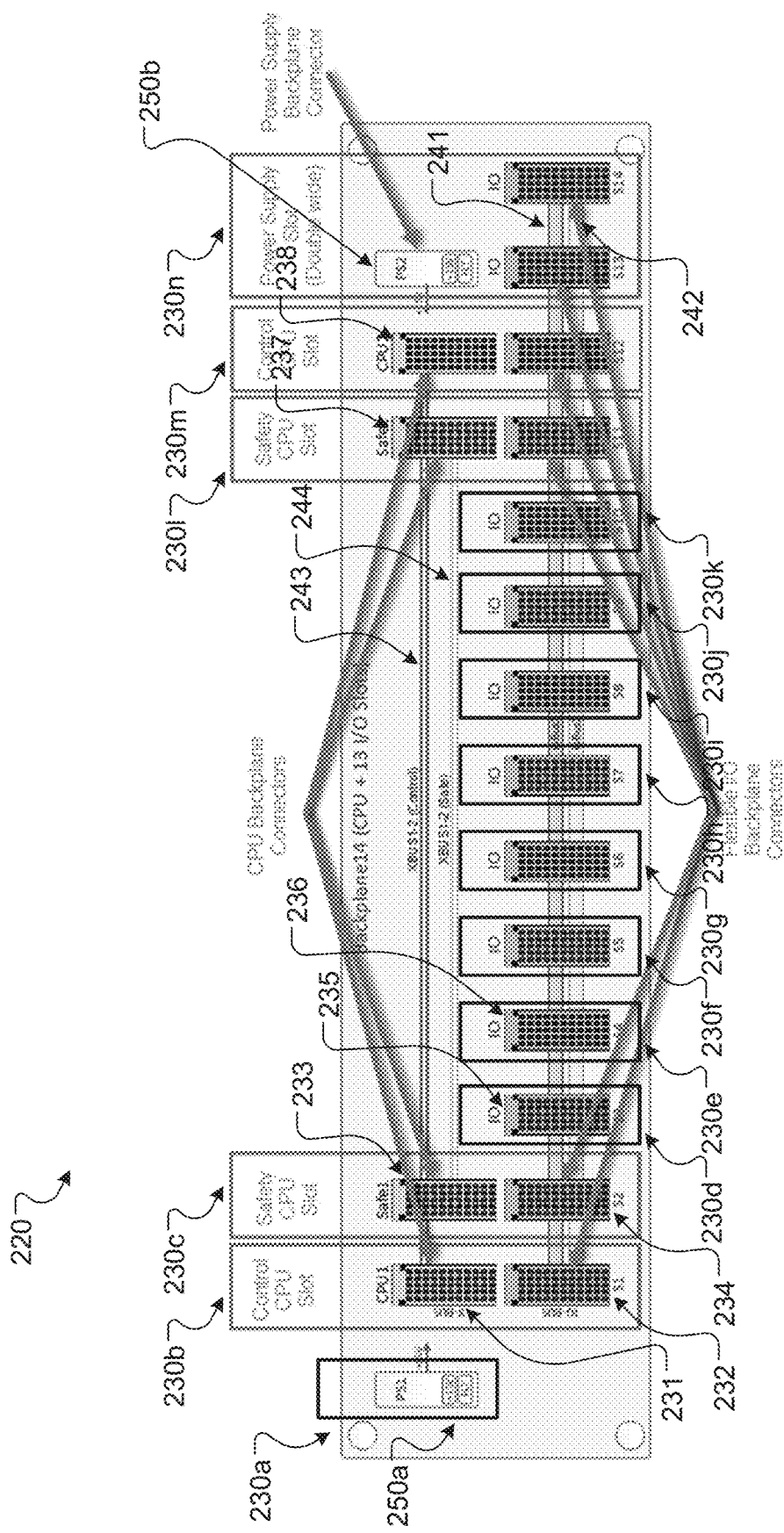
FIG. 2 is an illustration of an example backplane of an industrial system.

FIG. 2 is an illustration of an example backplane 220 of an industrial system. The backplane 220 may serve as a base for each module. In this example, the backplane 220 has fifteen slots 230a-n that are spaced apart along a horizontal direction, some slots (e.g., slots 230b, 230c, 230l, 230m, and 230n) also extending along a vertical direction. The backplane 220 uses the slots 230a-n for removably receiving one or more modules, e.g., modules 130a-n of FIG. 1.

Different modules may be installed on the backplane 220 in the same or different ways. In the example of FIG. 2, one or more power supply modules may be removably mounted or may be a fixed component and integrally mounted to the backplane 220, while one or more control processors, one or more safety processors, or one or more input/output processors may be removably inserted into the backplane 220.

The backplane 220 includes three general types of connectors: processor connection ports (e.g., connectors 231, 233, 237, 238), I/O connection ports (e.g., connectors 232, 234, 235, 236 along the bottom row of the backplane 220), and power supply connection ports 250a, 250b.

Processor connection ports provide a communication channel between processor modules connected to the backplane 220 through processors busses 243, 244. Each processor bus 243, 244 is electrically isolated from each other and provides a dedicated communication path between specific subsets of processor modules. For example, the communications between safety processors are isolated from communications between control processors. As another example, two pairs of control processors for different machines can be connected to the same backplane 220 and communications can be isolated between the different pairs.

I/O connection ports provide two alternate communication paths (I/O busses 241, 242). Each path can be used independently to communicate with a particular group of processor modules. Power supply connection ports connect to power supply modules and are used to distribute power to the backplane 220 and each hardware module connected to the backplane 220.

Each slot, e.g., slot 230b, has one or more connectors, e.g., connectors 231 and 232, that each occupy a respective space of the slot. Each slot can interface with a module via a corresponding connector on the module. In the example of FIG. 2, four out of the fourteen slots of the backplane 220 each have two connectors, these can be referred to as "processor slots" (e.g., processor slots 230b 230c, 230l, and 230m). Processor slots include a processor connection port and an I/O connection port. Because at least one power supply needs to be connected to the backplane 220 to supply power, one power supply slot 230a only includes a power supply connection port 250a. However, additional I/O connection ports are added to secondary power supply connection slots, e.g., slot 230n, to allow for expansion of additional I/O modules when additional power supplies are not needed. Each I/O slot, e.g., slot 230d, includes an I/O connection port, e.g., connector 235.

Each connector has multiple pins arranged within the space of the slot occupied by the connector. These pins may be of a complementary configuration and/or mating type than the pins used on the physical base of the modules, such that the connectors can engage (electrically connect with) and establish communication with the modules. For example, each connector has a number of female pins, while the physical base of a module has male pins in the same number. In this example, the male pins used on the physical base of the modules may be shrouded pins.

When the male pins used on the physical base of a module are in contact with, e.g., releasably inserted into, the female pins of a connector supported on the backplane 220, the module is electrically connected and communicatively coupled to the backplane 220 via the connector. It will be appreciated that the connector may be an electrical connector, optical connector, or any suitable connector to establish communication between the backplane 220 and the modules.

In particular, some of the connectors, e.g., all of the I/O connectors (e.g., connectors 232, 234, 235, 236, and the remaining bottom row connectors), include two sets of pins. The two sets of pins are separate (electrically isolated) from each other. In other words, the two sets of pins have no pins in common, where a first set of pins supports a first communication channel between a hardware module and the backplane 220, and a second set of pins supports a second communication channel between a hardware module and the backplane 220.

Multiple dedicated communication buses 241, 242, 243, and 244 are provided in the backplane 220 between the connectors. Data is transmitted via these communication buses between the modules that are electrically connected and communicatively coupled to the backplane 220 via the connectors. The backplane 220 is configured to accommodate high-speed and reliable data communications between the modules. In some implementations, because each bus is a dedicated bus configured to communicate between known modules, communication can occur in a predefined format, such as a proprietary communication protocol or utilizing a predefined communication schedule that requires little or no data overhead, such as headers, footers, checksums, and the like. However, each module must utilize the same protocol and be configured to communicate according to the predefined format on the backplane 220.

In particular, the backplane 220 includes two separate communication buses respectively coupled to the two sets of pins included in each of some of the connectors. In other words, for each of the I/O connectors, the backplane 220 includes one communication bus 241, coupled to the first set of pins of the connector, and another communication bus 242, coupled to the second set of pins of the connector, where the two communication buses are physically separated and electrically isolated from each other.

In the example of FIG. 2, the backplane 220 includes two power supply slots 230a and 230n, two control processor slots 230b and 230m, two safety processor slots 230c and 230l, and eight I/O slots 230d-k. Power supply slot 230a has one power supply connection port 250a for interfacing with a power supply module. Power supply slot 230n has one power supply connection port 250b for interfacing with a power supply module, and two I/O connection ports. Control processor slots 230b and 230m each have one processor connection port (e.g., connector 231 in slot 230b) and one I/O connection port (e.g., connector 232 in slot 230b). Safety processor slots 230c and 230l each have one processor connection port (e.g., connector 233 in slot 230c) and one I/O connection port (e.g., connector 234 in slot 230c). I/O slots 230d-k each have one I/O connection port (e.g., connector 235 in slot 230d) for interfacing with an I/O hardware module. It will be appreciated that in other examples, the backplane 220 can also be configured to support more or less slots, each having more or less connectors.

Figure 3:
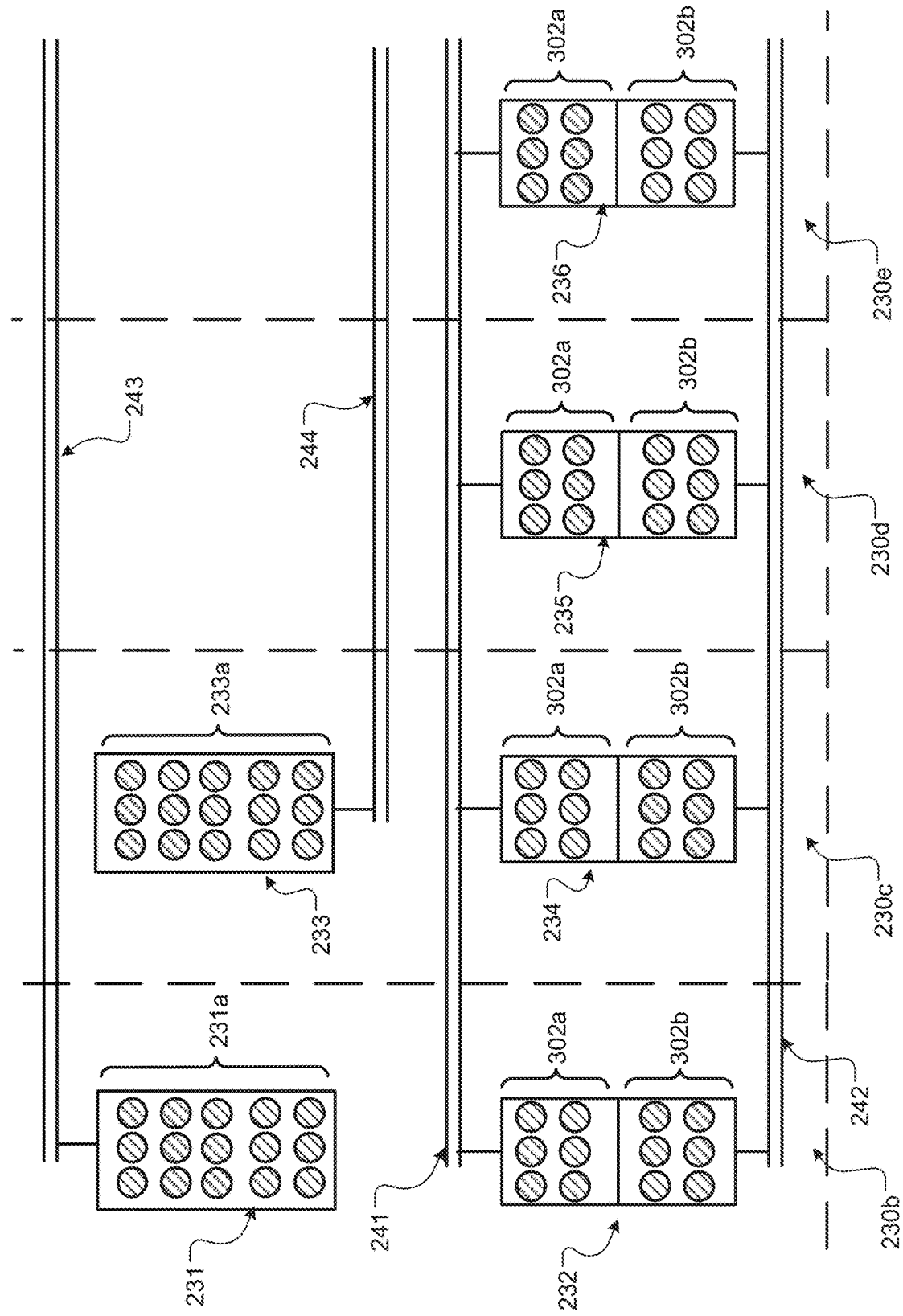
FIG. 3 is a simplified schematic diagram of a region of the backplane of the industrial system of FIG. 2.

FIG. 3 shows a simplified electrical schematic diagram of the backplane 220. FIG. 3 shows the bus architecture of the backplane 220 in more detail. For simplicity, FIG. 3 only shows the left-hand side of the backplane 220 including hardware slots 230b-230e. The description below is generally applicable to corresponding parts along the full backplane 220. For example, the backplane 220 can have four data communication busses 241, 242, 243, and 244. Busses 241 and 242 are I/O busses, and busses 243 and 244 are processor busses. The bus architecture provides flexibility by permitting two separate systems to be mounted on the backplane 220 and electrical isolated from one another while not strictly limiting particular slots for use with any one system. For example, the backplane 220 can be used to simultaneously for a machinery control system and a machinery safety system for the same machine. Alternatively, the backplane 220 can be used for two separate control systems for two separate machines.

In FIG. 3, each I/O bus 241, 242 connects with a different set of pins on each of the I/O connection ports (e.g., connectors 232, 234, 235, 236). Each connector 232, 234, 235, and 236 has a first set of pins 302a and a second set of pins 302b that are separate from each other and electrically isolated from each other. Within each connector 232, 234, 235, and 236, the first and second sets of pins 302a, 302b are located respectively at the upper and lower halves of the connector. In other implementations, the sets of pins can be located on either side of the connector, for example.

The I/O bus 241 is coupled to the first sets of pins 302a of the connectors 232, 234, 235, and 236. The I/O bus 242 is coupled to the second sets of pins 302b of the connectors 232, 234, 235, and 236. I/O bus 241 is physically separated and electrically isolated from I/O bus 242. For example, I/O bus 241 provides a data communication channel between I/O modules and processor modules connected to the first set of I/O communication port pins 302a in each slot. Similarly, I/O bus 242 provides a data communication channel between I/O modules and processor modules connected to the second set of I/O communication port pins 302b in each slot.

For example, a control I/O module, which is coupled to the backplane 220 in slot 230d and connected to the first set of pins 302a can communicates with a control processor module in slot 230b through I/O bus 241. A safety I/O module, which is coupled to the backplane 220 in slot 230e and connected to the second set of pins 302b can communicates with a safety processor module in slot 230c through I/O bus 242.

In the example implementation shown in FIGS. 2 and 3, each processor bus 243, 244 connects separate processor connection ports to allow data communication between multiple processor modules related to the same system or type of system (e.g., between two control processor modules and between two safety processor modules), but maintains data isolation between processor modules that are not related to the same system or type of system. Processor bus 243 provides a data communication channel between processor connection ports in slots 230b (connector 231) and in slot 230m (connector 238). Processor bus 244 provides a data communication channel between processor connection ports in slots 230c (connector 233) and in slot 230l (connector 237). For example, two safety processor modules may be connected to the same backplane 220 to provide redundancy and data sharing between the two may be required to carry out that function. But there should be no cross-talk between the safety processor modules and a control processor module connected to the same backplane 220. The processor bus architecture of the backplane 220 allows for two or more sets of processor modules to be connected to the backplane 220 with communication enabled between processor modules in the same set but communications isolated between different sets.

Figure 4C:
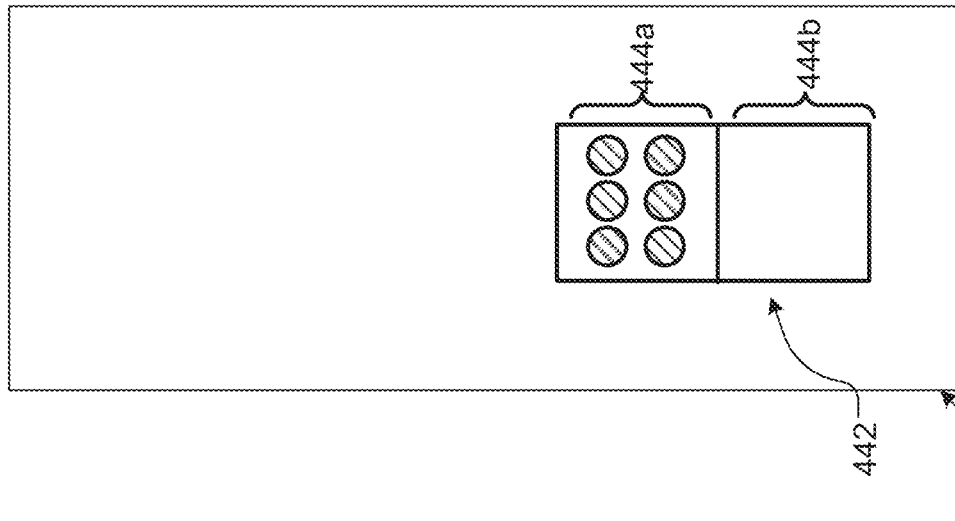
FIG. 4C is a block diagram of the back side of another example input/output (I/O) module compatible with the example backplane of FIG. 2.
Figure 4B:
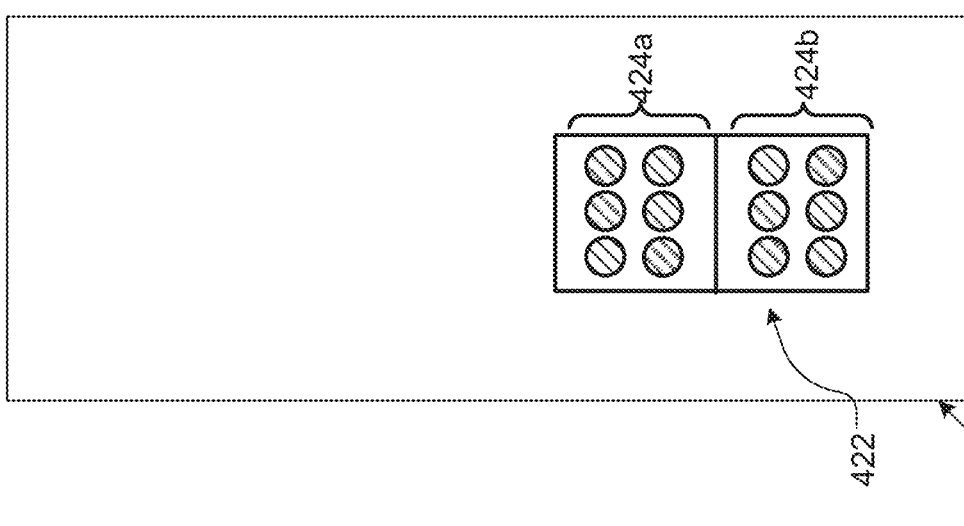
FIG. 4B is a block diagram of the back side of an example input/output (I/O) module compatible with the example backplane of FIG. 2.
Figure 4A:
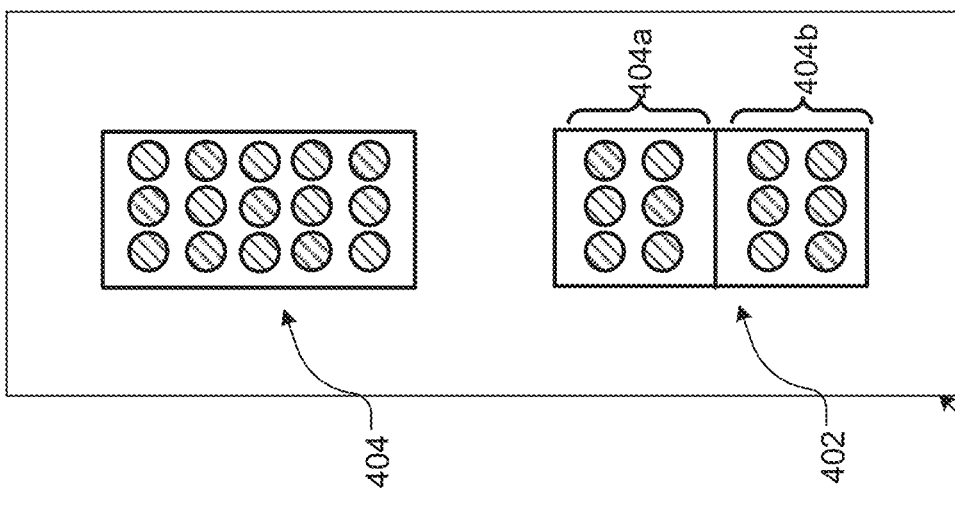
FIG. 4A is a block diagram of the back side of an example central processing unit (CPU) module compatible with the example backplane of FIG. 2.

FIG. 4A is a block diagram of the back side of an example central processing unit (CPU) module compatible with the example backplane of FIG. 2. A processor module 400 includes two connection ports; an I/O connection port 402 and a processor connection port 404. The I/O connection port 402 is configured to interface with the I/O connection ports on the backplane 220 (e.g., connectors 232, 234). The processor connection port 404 is configured to interface with any of the processor connection ports on the backplane 220 (e.g., connectors 231, 233, 237, 238). I/O connection port 402 is divided into two sets of pins: set 404a and 404b. In some implementations, during operation the processor module only communicates with other hardware modules using one set of pins on the I/O connection port 402. Thus, the processor module can isolate its communications on only one of the I/O busses on the backplane. In some implementations, the processor module 400 is configured to permit a user to select which set of I/O pins to use for output. For example, the processor module 400 can include a hardware switch that selects between pin sets 404a and 404b. One set is effectively turned off or disabled while the other is turned on or enabled to prevent cross-talk with hardware modules used for a different system (e.g., a safety system) on the same backplane 220. In other examples, the processor module can include software or firmware settings that allow a user to enable communications on one set of pins and disable communications on the other.

FIG. 4B is a block diagram of the back side of an example input/output (I/O) module compatible with the example backplane of FIG. 2. An I/O module 420 includes an I/O connection port 422 that is configured to interface with the I/O connection ports on the backplane 220 (e.g., connectors 232, 234, 235, 236, etc.). An I/O module 420 can be installed and operate in any one of slots 230b-230n of the backplane 220. The I/O connection port 422 is divided into two sets of pins: set 424a and 424b. During operation the I/O module 420 only communicates with other hardware modules using one set of pins on the I/O connection port 422. Thus, the I/O module 420 can isolate its communications on only one of the I/O busses on the backplane. In some implementations, the I/O module 420 is configured to permit a user to select which set of I/O pins to use for output. For example, the I/O module 420 can include a hardware switch that selects between pin sets 424a and 424b. One set is effectively turned off or disabled while the other is turned on or enabled to prevent cross-talk with hardware modules used for a different system (e.g., a safety system) on the same backplane 220. In other examples, the I/O module 420 can include software or firmware settings that allow a user to enable communications on one set of pins and disable communications on the other. In some implementations, the I/O connection port can be configured with only one set of pins. For example, an I/O module can be dedicated to communication on only one of the backplane's I/O busses. FIG. 4C is a block diagram of the back side of another example input/output (I/O) module 440 with only one set of pins, e.g., set 444a in an I/O connection port 442. For example, in some cases all hardware modules designed for use with control systems can be configured with only one set of I/O port pins, e.g., set 444a. In the same example, all hardware modules designed for use with safety systems can be configured with only the second set of pins 444b. Thus, one of the backplanes I/O busses can be configured as a dedicated control bus and the other can be configured as a dedicated safety bus.

For example, with reference to FIGS. 2-4, backplane 220 can include a power supply module installed in slot 230a, control processors modules installed in slots 230b and 230m, safety system processors installed in slots 230c and 230l, control I/O modules installed in slots 230d through 230i, and safety system I/O modules installed in slots 230j, 230k, 230n. The control processors can communicate with each other, and independent from the safety system processors, through processor bus 243 connected through connectors 231 and 238. Similarly, the safety system processors can communicate with each other, and independent from the control processors, through processor bus 244 connected through connectors 233 and 237. Furthermore, the control processors can be configured to communicate on their respective first set of I/O pins (e.g., pin set 404a). Therefore, the control processors can communicate with each respective control I/O module using the backplanes I/O bus 241 as a dedicated control I/O channel. Each respective control I/O module would also be configured to enable its respective first set of I/O pins (e.g., pin set 424a). Similarly, the safety system processors can be configured to communicate on their respective second set of I/O pins (e.g., pin set 404b). Therefore, the safety system processors can communicate with each respective safety I/O module using the backplanes I/O bus 242 as a dedicated safety I/O channel. Each respective safety system I/O module would also be configured to enable its respective second set of I/O pins (e.g., pin set 424b). In another example, independent control systems for two different machines can be installed on the same backplane 220 in a manner similar to that described above, with the second control system taking the place of the safety system.

As mentioned above, the industrial system has a flexible configuration, meaning that it has the flexibility for adding, removing and/or modifying the installed modules. Thus, in other implementations, it may be desirable to add a control processor, a safety processor, or an input/output processor, thereby increasing the capability or capacity of the industrial system. Similarly, it may be desirable to modify or remove an existing control processor, an existing safety processor, or an existing input/output processor due to changes in requirements in the industrial system, such as a controlled process or machine that has become obsolete. Moreover, the industrial system may be configured to use redundant modules to achieve a desired safety rating or a desired operational reliability. For example, the industrial system may include two control processors, two safety processors, two input/output processors, and two pairs of communication busses between each of the modules.

In these other implementations, various numbers of modules can be received by any of the unused connectors at any of the slots 230b-n of FIG. 2. For example, the connectors located at the input/output slots 230d-230k and the connectors located at the power supply slot 230n can each receive any type of input/output processor that is suitable according to the requirements of the controlled machine/process. The input/output processors may be analog or digital input/output processors, and the input/output processors may include only inputs, only outputs, or a combination thereof. The input/output processors may be configured to receive or supply DC voltage or AC voltage. In fact, some of the connectors can receive different types of modules. For example, the top connectors at the control processor slots 230b and 230m can each receive either a control processor, or a safety processor.

Figure 5:
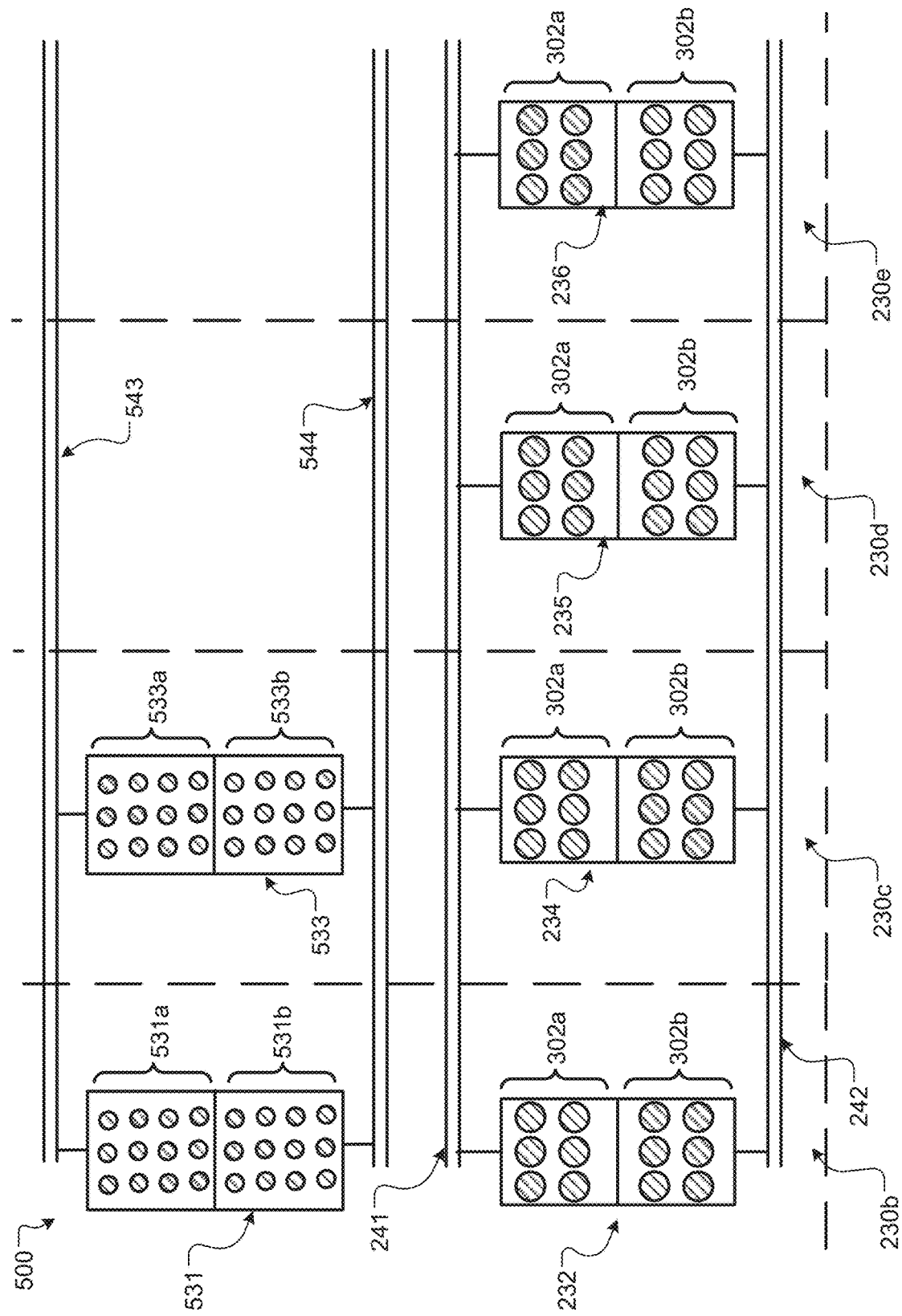
FIG. 5 is a simplified schematic diagram of a region of the backplane of the industrial system of FIG. 2 according to an alternate implementation.

FIG. 5 shows a simplified electrical schematic diagram of the backplane 220 according to an alternate embodiment 500. For simplicity, FIG. 5 only shows the left-hand side of the backplane 500 including hardware slots 230b-230e. The description below is generally applicable to corresponding parts along the full backplane 500. The bus architecture of the backplane 500 is similar to that of backplane 220 shown in FIG. 3, except that the processor connectors 531, 533 (corresponding with connectors 231, 233) are each divided into two sets of pins, (237, 238 which are not shown would likewise be divided into two sets of pins). Connector 531 is divided into pin sets 531a and 531b, and connector 533 is divided into pin set 533a and 533b. Furthermore, the processors busses 543 and 544 are extended to connect two both connectors 531 and 533. However, to maintain electrical isolation between processors each pin set is connected to a different processor bus. For instance, the upper pin sets 531a and 533a are connected to bus 543, while the lower pin sets 531b and 533b are connected to bus 544. The same configuration would be reflected on the right side of the backplane 500, as connectors 237 and 238 would be similarly modified.

As used herein, the terms "perpendicular," "substantially perpendicular," or "approximately perpendicular" refer to an orientation of two elements (e.g., lines, axes, planes, surfaces, walls, or components) with respect to one and other that forms a ninety degree (perpendicular) angle within acceptable engineering, machining, or measurement tolerances. For example, two surfaces can be considered orthogonal to each other if the angle between the surfaces is within an acceptable tolerance of ninety degrees (e.g., ±1-5 degrees).

As used herein, the terms "aligned," "substantially aligned," "parallel," or "substantially parallel" refer to a relation between two elements (e.g., lines, axes, planes, surfaces, or components) as being oriented generally along the same direction within acceptable engineering, machining, drawing measurement, or part size tolerances such that the elements do not intersect or intersect at a minimal angle. For example, two surfaces can be considered aligned with each other if surfaces extend along the same general direction of a device.

It should be noted that the orientation of various elements may differ according to other exemplary embodiments, and that such variations are intended to be encompassed by the present disclosure.

Some of the features or components described can be implemented in digital electronic circuitry, or in computer hardware, firmware, software, or in combinations of them (e.g., the hardware modules 130a-130n). The apparatus can be implemented in a computer program product tangibly embodied in an information carrier, e.g., in a machine-readable storage device for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random-access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

While a number of examples have been described for illustration purposes, the foregoing description is not intended to limit the scope of the invention, which is defined by the scope of the appended claims. There are and will be other examples and modifications within the scope of the following claims. Although only a few embodiments of the present inventions have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the description and advantages of the subject matter disclosed herein. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present invention as defined in the appended claims. Other substitutions, modifications, changes and omissions may be made in the design, operating conditions and arrangement of the various exemplary embodiments without departing from the scope of the present inventions.

The invention claimed is:

1. An electronic backplane comprising:
    a first processor slot comprising a first processor connection port having a plurality of pins electrically connected to a first processor bus;
    a second processor slot comprising a second processor connection port having a plurality of pins connected to a second processor bus, that is electrically isolated from the first processor bus;
    a plurality of input/output (I/O) slots;
    a first I/O bus;
    a second I/O bus electrically isolated from the first I/O bus; and
    a plurality of I/O connection ports each comprising a first set of pins electrically connected to the first I/O bus, and a second set of pins electrically connected to the second I/O bus, and
    wherein;
        the plurality of I/O connection ports are aligned in a first row along the electronic backplane;
        the first processor connection port and the second processor connection port are aligned in a second row; and
        each of the first processor slot, the second processor slot, and the plurality of I/O slots comprise at least one of the I/O connection ports.

2. The electronic backplane of claim 1 comprising:
    a third processor slot comprising a third processor connection port having a plurality of pins electrically connected to the first processor bus enabling communication with a processor module connected to the first processor connection port of the first processor slot; and
    a fourth processor slot comprising a fourth processor connection port having a plurality of pins electrically connected to the second processor bus enabling communication with a processor module connected to the second processor connection port of the second processor slot.

3. The electronic backplane of claim 1 comprising a power supply slot comprising a power connection port having at least two pins electrically connected to a power bus, and at least one of the I/O connection ports.

4. The electronic backplane of claim 3, wherein the power supply slot comprises at least two of the I/O connection ports.

5. The electronic backplane of claim 1 comprising:
    a first I/O module installed in a first one of the I/O slots and electrically connected to the I/O connection port of the first one of the I/O slots, the first I/O module configured to send and receive data communications only through the first set of pins; and
    a second I/O module installed in a second one of the I/O slots and electrically connected to the I/O connection port of the second one of the I/O slots, the second I/O module configured to send and receive data communications only through the second set of pins.

6. The electronic backplane of claim 5 wherein the first I/O module is a control I/O module and the second I/O module is a safety I/O module.

7. The electronic backplane of claim 5, wherein the first I/O module comprises a first I/O port connection interface that has a first set of interface pins that align with and couple to the first set of pins of the I/O connection port of the first one of the I/O slots, and
    wherein the second I/O module comprises a second I/O port connection interface that has a second set of interface pins that align with and couple to the second set of pins of the I/O connection port of the second one of the I/O slots.

8. The electronic backplane of claim 5, wherein the first I/O module comprises a first I/O port connection interface that has a first set of interface pins that align with and couple to the first set of pins of the I/O connection port of the first one of the I/O slots, and a second set of interface pins that align with and couple to the second set of pins of the I/O connection port of the first one of the I/O slots, and
wherein the first I/O module is configured to disable data communications through the second set of interface pins.

9. The electronic backplane of claim 8, wherein the first I/O module comprises non-transitory computer readable memory comprising computer instructions that, when executed, disable data communications through the second set of interface pins.

10. The electronic backplane of claim 1, wherein the first processor connection port comprises a third set of pins and a fourth set of pins,
wherein the third set of pins comprises the plurality of pins that are electrically connected to the first processor bus, and
wherein the fourth set of pins are electrically connected to the second processor bus.

11. The electronic backplane of claim 1, wherein, during operation of the electronic backplane, only one of the first set of pins or the second set of pins of an I/O connection port is enabled for data communications.

12. An industrial system comprising:
a machine; and
a control and safety system coupled to the machine and configured to operate the machine, the control and safety system comprising:
an electronic backplane comprising:
a first input/output (I/O) bus,
a second I/O bus electrically isolated from the first I/O bus,
a plurality of I/O connection ports each comprising a first set of pins electrically connected to the first I/O bus, and a second set of pins electrically connected to the second I/O bus, wherein, during operation of the industrial system, only one of the first set of pins or the second set of pins of an I/O connection port is enabled for data communications;
a plurality of module slots each configured to receive a hardware module and each module slot comprising an I/O connection port,
a control processor module installed in a first one of the module slots,
a safety processor module installed in a second one of the module slots,
a control I/O module installed in a third one of the module slots, and
a safety I/O module installed in a fourth one of the module slots,
wherein the control processor module is configured to communicate control data with the control I/O module through the first I/O bus, and
wherein the safety processor module is configured to communicate safety data with the safety I/O module through the second I/O bus.

13. The industrial system of claim 12, wherein the control I/O module comprises a first I/O port connection interface that has a first set of interface pins that align with and couple to the first set of pins of the I/O connection port of the third one of the I/O slots, and
wherein the safety I/O module comprises a second I/O port connection interface that has a second set of interface pins that align with and couple to the second set of pins of the I/O connection port of the fourth one of the I/O slots.

14. The industrial system of claim 12, wherein the control I/O module comprises an I/O port connection interface that has a first set of interface pins that align with and couple to the first set of pins of the I/O connection port of the third one of the I/O slots, and a second set of interface pins that align with and couple to the second set of pins of the I/O connection port of the third one of the I/O slots, and
wherein the control I/O module is configured to disable data communications through the second set of interface pins.

15. The industrial system of claim 14, wherein the control I/O module comprises non-transitory computer readable memory comprising computer instructions that, when executed, disable data communications through the second set of interface pins.

16. The industrial system of claim 12, wherein the safety I/O module comprises an I/O port connection interface that has a first set of interface pins that align with and couple to the first set of pins of the I/O connection port of the fourth one of the I/O slots, and a second set of interface pins that align with and couple to the second set of pins of the I/O connection port of the fourth one of the I/O slots, and
wherein the safety I/O module is configured to disable data communications through the first set of interface pins.

17. The industrial system of claim 16, wherein the safety I/O module comprises non-transitory computer readable memory comprising computer instructions that, when executed, disable data communications through the first set of interface pins.

18. The industrial system of claim 12, wherein the plurality of I/O connection ports are aligned in a row along a bottom of the electronic backplane.

19. An electronic backplane comprising:
a first input/output (I/O) bus;
a second I/O bus electrically isolated from the first I/O bus;
a plurality of I/O connection ports each comprising a first set of pins electrically connected to the first I/O bus, and a second set of pins electrically connected to the second I/O bus, wherein the plurality of I/O connection ports are aligned in a first row along the electronic backplane;
a first processor slot configured to receive a first processor module and comprising a first one of the I/O connection ports and a first processor connection port having a plurality of pins electrically connected to a first processor bus;
a second processor slot configured to receive a second processor module and comprising a second one of the I/O connection ports and a second processor connection port having a plurality of pins connected to a second processor bus, that is electrically isolated from the first processor bus, wherein the first processor connection port and the second processor connection port are aligned in a second row;
a third processor slot configured to receive a third processor module and comprising a third one of the I/O connection ports and a third processor connection port having a plurality of pins electrically connected to the first processor bus enabling data communication through the first processor connection port of the first processor slot;

a fourth processor slot configured to receive a fourth processor module and comprising a fourth one of the I/O connection ports and a fourth processor connection port having a plurality of pins electrically connected to the second processor bus enabling data communication through the second processor connection port of the second processor slot;

a power supply slot configured to receive a power supply and comprising a power connection port having at least two pins electrically connected to a power bus and a fifth one of the I/O connection ports; and a plurality of I/O slots each configured to receive a hardware module and each I/O slot comprising at least one of the I/O connection ports.

20. The electronic backplane of claim 19 comprising:

a first I/O module installed in a first one of the I/O slots and electrically connected to the I/O connection port of the first one of the I/O slots, the first I/O module configured to send and receive data communications only through the first set of pins; and a second I/O module installed in a second one of the I/O slots and electrically connected to the I/O connection port of the second one of the I/O slots, the second I/O module configured to send and receive data communications only through the second set of pins.

* * * * *